US011069387B2

(12) United States Patent
Park et al.

(10) Patent No.: US 11,069,387 B2
(45) Date of Patent: Jul. 20, 2021

(54) MEMORY SYSTEM AND METHOD OF OPERATING THE MEMORY SYSTEM

(71) Applicant: SK hynix Inc., Gyeonggi-do (KR)

(72) Inventors: Chang Kyun Park, Gyeonggi-do (KR);
Young Sik Koh, Gyeonggi-do (KR);
Seung Jin Park, Gyeonggi-do (KR);
Dong Hyun Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/679,582

(22) Filed: Nov. 11, 2019

(65) Prior Publication Data

US 2020/0349987 A1  Nov. 5, 2020

(30) Foreign Application Priority Data

Apr. 30, 2019  (KR) .................. 10-2019-0050617

(51) Int. Cl.
*G11C 7/22* (2006.01)
*G11C 7/10* (2006.01)

(52) U.S. Cl.
CPC ............ *G11C 7/222* (2013.01); *G11C 7/1063* (2013.01); *G11C 7/1066* (2013.01); *G11C 7/1093* (2013.01); *G11C 2207/2254* (2013.01)

(58) Field of Classification Search
CPC .. G11C 8/18; G11C 7/22; G11C 7/222; G11C 7/1066; G11C 7/1063; G11C 7/1093; G11C 2207/2254; G11C 11/5671; G11C 16/26; G11C 16/10; G11C 16/0483; G11C 16/20; G11C 16/32; G11C 29/50012; G11C 2029/0407; G11C 29/022; G11C 29/028

USPC .......................................... 365/233.1, 193
See application file for complete search history.

(56) References Cited

U.S. PATENT DOCUMENTS

| 6,738,880 B2 | 5/2004 | Lai et al. |
| 6,813,682 B2 | 11/2004 | Bress et al. |
| 7,339,838 B2 | 3/2008 | LaBerge |
| 7,500,075 B1 | 3/2009 | Garrett, Jr. |

(Continued)

FOREIGN PATENT DOCUMENTS

| KR | 10-2010-0099892 | 9/2010 |
| KR | 10-2014-0088730 | 7/2014 |

(Continued)

OTHER PUBLICATIONS

Office Action by the USPTO for U.S. Appl. No. 16/679,561 dated Oct. 19, 2020.

(Continued)

*Primary Examiner* — Michael T Tran
(74) *Attorney, Agent, or Firm* — IP & T Group LLP

(57) ABSTRACT

The present technology includes a memory system and a method of operating the memory system. The memory system includes a memory device including an interface circuit and a semiconductor memory, and a controller configured to generate a command for controlling the memory device and output the command to the memory device. The interface circuit receives the command, transmits the received command to the semiconductor memory when the received command corresponds to the semiconductor memory, and performs a training operation of the interface circuit when the received command corresponds to the interface circuit and the received command is a specific command.

19 Claims, 11 Drawing Sheets

(56) References Cited

U.S. PATENT DOCUMENTS

| | | | |
|---|---|---|---|
| 8,364,881 B2 | 1/2013 | Urabe | |
| 9,025,384 B2 | 5/2015 | Lee et al. | |
| 9,037,774 B2 | 5/2015 | Solomon et al. | |
| 9,093,132 B2 | 7/2015 | Kim et al. | |
| 9,536,590 B1 | 1/2017 | Zhu et al. | |
| 10,002,652 B1 | 6/2018 | Seong et al. | |
| 10,073,643 B2 | 9/2018 | Jung et al. | |
| 10,229,743 B1* | 3/2019 | Han | G11C 29/028 |
| 10,430,361 B1 | 10/2019 | Wiebe et al. | |
| 10,496,332 B2 | 12/2019 | Srivastava et al. | |
| 10,714,162 B2 | 7/2020 | Koh | |
| 10,747,463 B2* | 8/2020 | Kajigaya | G06F 3/061 |
| 2002/0040418 A1 | 4/2002 | Bress et al. | |
| 2002/0069381 A1 | 6/2002 | Jeong et al. | |
| 2004/0186953 A1 | 9/2004 | Bress et al. | |
| 2004/0193834 A1 | 9/2004 | Emberling | |
| 2006/0053353 A1 | 3/2006 | Youn et al. | |
| 2007/0206400 A1 | 9/2007 | Bress et al. | |
| 2008/0030221 A1 | 2/2008 | Lee et al. | |
| 2008/0080226 A1 | 4/2008 | Mikolajick et al. | |
| 2008/0123217 A1* | 5/2008 | Ishii | G11B 5/6005 360/78.04 |
| 2009/0016124 A1 | 1/2009 | Kim | |
| 2009/0080374 A1* | 3/2009 | Lee | H04L 47/70 370/328 |
| 2010/0008177 A1* | 1/2010 | Joo | G11C 7/1066 365/233.11 |
| 2010/0054059 A1* | 3/2010 | Yoon | G11C 7/222 365/194 |
| 2010/0054073 A1* | 3/2010 | Park | G11C 7/109 365/233.1 |
| 2010/0161933 A1* | 6/2010 | Moon | G06F 12/0246 711/205 |
| 2011/0050295 A1* | 3/2011 | Kim | G06F 1/12 327/115 |
| 2011/0218949 A1* | 9/2011 | Cho | G06N 20/00 706/12 |
| 2011/0296068 A1* | 12/2011 | Fredenberg | G06F 13/1615 710/120 |
| 2011/0296124 A1* | 12/2011 | Fredenberg | G06F 12/0284 711/157 |
| 2012/0106278 A1* | 5/2012 | Na | G11C 7/1072 365/194 |
| 2013/0272073 A1 | 10/2013 | Hendrickson | |
| 2014/0181452 A1* | 6/2014 | Malladi | G11C 29/028 711/166 |
| 2015/0170724 A1 | 6/2015 | Shaeffer et al. | |
| 2015/0214172 A1 | 7/2015 | Lin et al. | |
| 2016/0062690 A1* | 3/2016 | Shin | G06F 3/0634 711/103 |
| 2016/0180898 A1* | 6/2016 | Hwang | G11C 7/1063 711/103 |
| 2016/0180914 A1* | 6/2016 | Kong | G11C 11/4093 365/189.05 |
| 2018/0004688 A1* | 1/2018 | Chung | G06F 13/1673 |
| 2018/0233184 A1 | 8/2018 | Choi | |
| 2018/0373313 A1 | 12/2018 | Hasbun | |
| 2019/0004984 A1* | 1/2019 | Lee | G06K 9/6255 |
| 2019/0034365 A1* | 1/2019 | Lovelace | G06F 13/1689 |
| 2019/0038151 A1* | 2/2019 | Lee | A61B 5/6898 |
| 2019/0042120 A1* | 2/2019 | Kajigaya | G06F 3/0659 |
| 2019/0079699 A1* | 3/2019 | Lee | G11C 29/028 |
| 2019/0095223 A1* | 3/2019 | Dubel | G06F 13/4286 |
| 2019/0130950 A1* | 5/2019 | Kim | G11C 7/106 |
| 2019/0156247 A1* | 5/2019 | Faulhaber, Jr. | G06N 20/00 |
| 2019/0212769 A1* | 7/2019 | Carlough | G11C 7/222 |
| 2019/0280600 A1* | 9/2019 | Rowley | H01L 23/50 |
| 2019/0295658 A1* | 9/2019 | Amaki | G11C 16/26 |
| 2019/0296723 A1* | 9/2019 | Tang | G06F 1/10 |
| 2019/0303310 A1 | 10/2019 | Richter et al. | |
| 2019/0310784 A1* | 10/2019 | Kim | G06F 3/068 |
| 2019/0317683 A1* | 10/2019 | Mayer | G11C 29/023 |
| 2019/0318555 A1* | 10/2019 | Hansel | G11C 5/141 |
| 2019/0339881 A1* | 11/2019 | Scott, III | G11C 16/10 |
| 2019/0348095 A1* | 11/2019 | Koh | G11C 7/10 |
| 2019/0355435 A1* | 11/2019 | Liikanen | G11C 29/42 |
| 2019/0362763 A1 | 11/2019 | Lee et al. | |
| 2019/0392891 A1* | 12/2019 | Hong | G06F 13/4282 |
| 2020/0133505 A1* | 4/2020 | Kim | G06F 3/0673 |
| 2020/0133540 A1* | 4/2020 | Pilolli | G06F 3/0659 |
| 2020/0133542 A1* | 4/2020 | Kim | G11C 11/4076 |
| 2020/0160902 A1* | 5/2020 | Gans | G11C 29/028 |
| 2020/0192791 A1* | 6/2020 | Yang | G06F 11/1068 |
| 2020/0211640 A1* | 7/2020 | Sharon | G06F 9/3004 |
| 2020/0241984 A1* | 7/2020 | Shim | G11C 29/08 |
| 2020/0264884 A1* | 8/2020 | Jung | G11C 7/106 |
| 2020/0265876 A1* | 8/2020 | Takefman | G11C 7/1093 |
| 2020/0372940 A1 | 11/2020 | Park et al. | |
| 2020/0372941 A1 | 11/2020 | Park et al. | |

FOREIGN PATENT DOCUMENTS

| | | |
|---|---|---|
| KR | 10-2015-0143943 | 12/2015 |
| KR | 10-2016-0041717 | 4/2016 |
| KR | 10-2018-0006654 | 1/2018 |

OTHER PUBLICATIONS

Kim, H.J. et al., 1GB/s 2Tb NAND Flash Multi-Chip Package with Frequency-Boosting Interface Chip, ISSCC 2015 Session 7.

Notice of Allowance issued by the USPTO for U.S. Appl. No. 16/992,465 dated Apr. 16, 2021.

* cited by examiner

1000

1000

MEMORY SYSTEM AND METHOD OF OPERATING THE MEMORY SYSTEM

CROSS-REFERENCE TO RELATED APPLICATION

The present application claims priority under 35 U.S.C. § 119(a) to Korean patent application number 10-2019-0050617 filed on Apr. 30, 2019, which is incorporated herein by reference in its entirety.

BACKGROUND

Field of Invention

The present disclosure relates to an electronic device, and more particularly, to a memory system and a method of operating the memory system.

Description of Related Art

Recently, a paradigm for a computer environment has been transformed into ubiquitous computing, which enables a computer system to be used whenever and wherever. Therefore, use of a portable electronic device such as a mobile phone, a digital camera, and a notebook computer, is rapidly increasing. Such a portable electronic device generally uses a memory system that uses a memory device, that is, a data storage device. The data storage device is used as a main storage device or an auxiliary storage device of the portable electronic device.

The data storage device using the memory device has advantages in that stability and durability are excellent because there is no mechanical driver, access speed of information is very fast, and power consumption is low. An example of a memory system having such advantages, is a data storage device which includes at least one of a universal serial bus (USB) memory device, a memory card having various interfaces, a solid state drive (SSD), and the like.

A memory device is largely divided into a volatile memory device and a nonvolatile memory device.

A writing speed and a reading speed of the nonvolatile memory device are relatively slow, however, the nonvolatile memory device maintains storage data even when a power supply is shut off. Therefore, a nonvolatile memory device is used to store data to be maintained regardless of power supply. A nonvolatile memory device includes a read only memory (ROM), a mask ROM (MROM), a programmable ROM (PROM), an erasable programmable ROM (EPROM), an electrically erasable programmable ROM (EEPROM), a flash memory, a phase change random access memory (PRAM), a magnetic RAM (MRAM), a resistive RAM (RRAM), a ferroelectric RAM (FRAM), and the like. The flash memory is divided into a NOR type and a NAND type.

In general, a memory device may receive data or transmit data in synchronization with a clock. The memory device may transmit and receive data using a strobe signal having the same period as the clock. For example, the memory device may receive data transmitted from a memory controller in response to a strobe signal during a write operation, and may output data together with the strobe signal to the memory controller in synchronization with the strobe signal during a read operation. Therefore, in order to improve operation reliability of the memory device, controlling a timing between the clock, the strobe signal, and the data is important. As an operation speed of the memory device is improved, the timing of the clock, the strobe signal, and the data are changed depending on various environments.

To solve this, the memory device may perform a write training operation and a read training operation. A write training and a read training may be implemented in various forms. For example, a data latch margin may be measured by performing the write training operation and the read training operation, and the data or the strobe signal may be delayed and set according to the measurement result.

SUMMARY

An embodiment of the present disclosure provides a memory system and a method of operating the memory system capable of efficiently controlling an interface circuit for data communication between a memory controller and a semiconductor memory.

A memory system according to an embodiment of the present disclosure includes a memory device including an interface circuit and a semiconductor memory, and a controller configured to generate a command for controlling the memory device and output the command to the memory device. The interface circuit receives the command, transmits the received command to the semiconductor memory when the received command corresponds to the semiconductor memory, and performs a training operation of the interface circuit when the received command corresponds to the interface circuit and the received command is a specific command.

A memory system according to an embodiment of the present disclosure includes a controller configured to generate and output a first command or a second command corresponding to a training operation, an interface circuit configured to perform a first training operation thereto in response to the first command, or transfer the second command to a memory device, and the memory device configured to perform a second training operation in response to the second command.

A method of operating a memory system according to an embodiment of the present disclosure includes providing an interface circuit connected between a controller and a semiconductor memory, the interface circuit configured to mediate data communication between the controller and the semiconductor memory, generating, by the controller, a first command for the training operation of the interface circuit or a second command for the training operation of the semiconductor memory, and transmitting the first command or the second command to the interface circuit, performing, by the interface circuit, the training operation in response to the first command, and blocking, by the interface circuit, transfer of the first command to the semiconductor memory during the training operation of the interface circuit, and transmitting, by the interface circuit, the second command to the semiconductor memory to perform, by the semiconductor memory, the training operation in response to the second command.

An interface circuit for transferring a signal between a controller and a memory device according to an embodiment of the present disclosure includes a training circuitry configured to: block transfer of a signal provided thereto in response to a training command from the controller, and write and read training data thereto and therefrom in response to the training command; and a timing circuitry configured to transfer the training data between the training circuitry and the controller. The training circuitry is further configured to generate a delay control signal to synchronize the training data and an internal clock of the interface circuit with each other as a result of the writing, reading and transferring of the training data, and the timing circuitry is further configured to rearrange a timing of the signal provided thereto according to the delay control signal.

The present technology may block transfer of the command from the memory controller to the semiconductor memory in order to control the training operation of the interface circuit and may perform the write training operation and the read training operation of the interface circuit in response to the received command.

DETAILED DESCRIPTION

Figure 1:
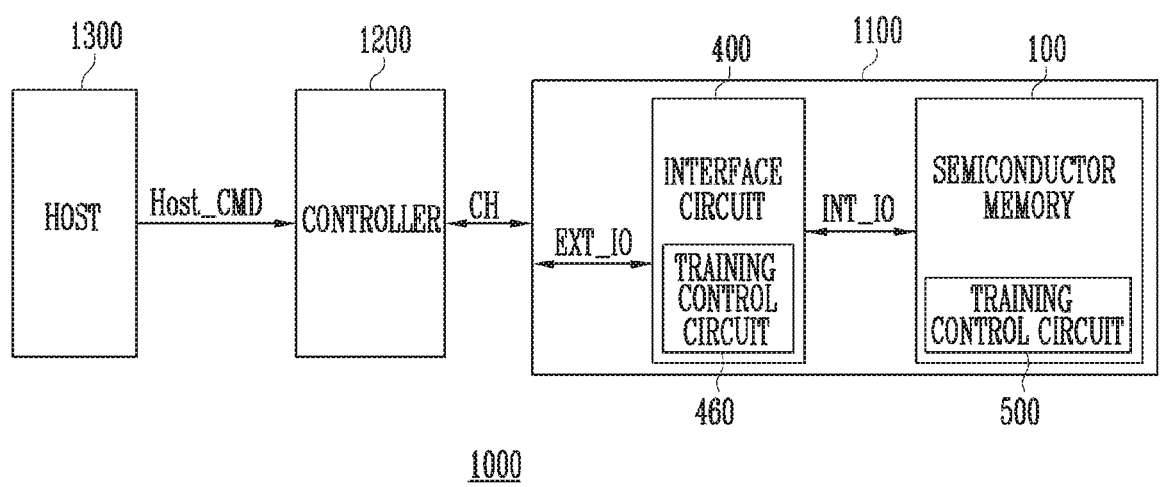
FIG. 1 is a block diagram describing a memory system according to an embodiment of the present disclosure.

Specific structural or functional descriptions of embodiments according to concepts which are disclosed in this specification or application are illustrated only to describe the embodiments according to the concepts of the present disclosure. The embodiments according to the concepts of the present disclosure may be carried out by various forms but the descriptions are not limited to the embodiments described in this specification or application.

It is noted that reference to "an embodiment," "another embodiment" or the like does not necessarily mean only one embodiment, and different references to any such phrase are not necessarily to the same embodiment(s).

Since various modifications and changes may be applied to the embodiments according to the concepts of the present disclosure, the specific embodiments will be illustrated in the drawings and described in this specification or application. However, it should be understood that the embodiments according to the concept of the present disclosure are not construed as limited to specified disclosures, and include all changes, equivalents, or substitutes that do not depart from the spirit and technical scope of the present disclosure.

While terms such as "first" and/or "second" may be used to describe various elements, such elements should not be understood as being limited to the above terms. The above terms may be used to distinguish one element from the other element, for example, a first element may be referred to as a second element without departing from a scope according to the concept of the present disclosure and similarly, a second element may be referred to as a first element.

It will be understood that when an element is referred to as being "connected" or "coupled" to another element, it may be directly connected or coupled to the other element or an intervening element may also be present. In contrast, when an element is referred to as being "directly connected" or "directly coupled" to another element, no intervening element is present. Other expressions describing relationships between elements such as "~between," "immediately~between" or "adjacent to~" and "directly adjacent to~" may be construed similarly.

The terms used in this specification are merely used to describe specific embodiments, and are not intended to limit the present disclosure. Singular forms are intended to include the plural forms as well, unless the context clearly indicates otherwise. The articles 'a' and 'an' as used in this application and the appended claims should generally be construed to mean 'one or more' unless specified otherwise or clear from context to be directed to a singular form. In this specification, it should be understood that terms "include" or "have" indicate that a feature, a number, a step, an operation, an element, a part or a combination thereof described in this specification is present, but do not exclude a possibility of presence or addition of one or more other features, numbers, steps, operations, elements, parts, or combinations thereof.

So far as not being differently defined, all terms used herein including technical or scientific terminologies have meanings that are commonly understood by those skilled in the art to which the present disclosure pertains. The terms defined in generally used dictionaries should be construed as having the same meanings as would be construed in the context of the related art, and unless clearly defined otherwise in this specification, should not be construed as having idealistic or overly formal meanings.

In describing the embodiments, description of technical contents which are well known in the technical field of the present disclosure and are not directly related to the present disclosure will be omitted. This intends to disclose the gist of the present disclosure more clearly by omitting unnecessary description.

Hereinafter, embodiments of the present disclosure will be described in detail with reference to the accompanying drawings, so that those skilled in the art may easily carry out the technical spirit of the present disclosure.

FIG. 1 is a block diagram describing a memory system according to an embodiment of the present disclosure.

Referring to FIG. 1, a memory system 1000 includes a memory device 1100 in which data is stored, a controller 1200 that controls the memory device 1100 under control of a host 1300.

The host 1300 may communicate with the controller by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 1300 and the controller 1200 is not limited to the above-described example, and may be one of other interface protocols such as a universal serial bus (USB), a multi-media card (MMC), an enhanced small disk interface (ESDI), and integrated drive electronics (IDE).

The controller 1200 may generally control an operation of the memory system 1000 and control data exchange between the host 1300 and the memory device 1100. For example, the controller 1200 may control the memory device 1100 in response to a request from the host 1300 to program or read data. The controller 1200 may control to perform a write training operation and a read training operation of an interface circuit 400 or a semiconductor memory 100 included in the memory device 1100 according to the request of the host 1300. In addition, the controller 1200 may control the write training operation and the read training operation of the interface circuit 400 or the semiconductor memory 100 after a power up operation.

The controller 1200 may generate a command for controlling the memory device 1100 in response to a host command Host_CMD corresponding to the request of the host 1300 and transmit the command to the memory device 1100, or may generate a command for controlling the memory 1100 after the power up operation and transmit the command to the memory device 1100. When the controller 1200 generates the command for controlling the semiconductor memory 100 included in the memory device 1100, the controller 1200 generates the command so that an address corresponding to the semiconductor memory 100 is included in the command. In addition, when the controller 1200 generates the command for controlling the interface circuit 400 included in the memory device 1100, the controller 1200 generates the command so that an address corresponding to the interface circuit 400 is included in the command.

According to an embodiment, the memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), or a flash memory.

The memory device 1100 may be connected to the controller 1200 through a channel CH and may include the semiconductor memory 100 and the interface circuit 400. The semiconductor memory 100 may communicate with the controller 1200 through the interface circuit 400. For example, the interface circuit 400 may mediate command and data communication between the controller 1200 and the semiconductor memory 100. In addition, the interface circuit 400 may perform an operation of controlling and rearranging a timing of data exchanged between the controller 1200 and the semiconductor memory 100. The interface circuit 400 may rearrange the data exchanged between the controller 1200 and the semiconductor memory 100 to reduce skew of transmitted data and improve reliability. The interface circuit 400 may be connected to the channel CH through an external input/output line EXT_IO and may be connected to the semiconductor memory 100 through an internal input/output line INT_IO.

In addition, the interface circuit 400 may include a training control circuit 460 and may perform a training operation of the interface circuit 400 in response to a specific command (for example, a first command) received from the controller 1200. In response to the first command, the training control circuit 460 of the interface circuit 400 may perform a write training operation of storing training data in the interface circuit 400, determining an amount of mismatch between timings of internal clocks and data of the interface circuit 400 during the write training operation, and correcting the amount of mismatch; and may perform a read training operation of reading the training data stored in the interface circuit 400, outputting the training data to the controller 1200, determining an amount of mismatch between timings of the internal clocks and the data of the interface circuit 400 during the read training operation, and correcting the amount of mismatch. When the first command is received from the controller 1200, the interface circuit 400 blocks transfer of the first command to the semiconductor memory 100 in order to prevent malfunction of the semiconductor memory 100 due to the first command.

In addition, the interface circuit 400 performs an operation of transmitting a specific command (for example, a second command) received from the controller 1200 to the semiconductor memory 100.

The semiconductor memory 100 may include a plurality of memory cells capable of storing and reading data. In addition, the semiconductor memory 100 may include a training control circuit 500, and the training control circuit 500 may perform a training operation of the semiconductor memory 100 in response to the second command received through the interface circuit 400. In response to the second command, the training control circuit 500 of the semiconductor memory 100 may perform a write training operation of storing training data in the memory cells included in the semiconductor memory 100, determining an amount of mismatch between timings of internal clocks and data of the semiconductor memory 100 during the write training operation, and correcting the mismatch; and may perform a read training operation of reading the training data stored in the memory cells of the semiconductor memory 100, outputting the training data to the interface circuit 400, determining an amount of mismatch between timings of the internal clocks and the data of the semiconductor memory 100 during the read training operation, and correcting the mismatch.

Figure 2:
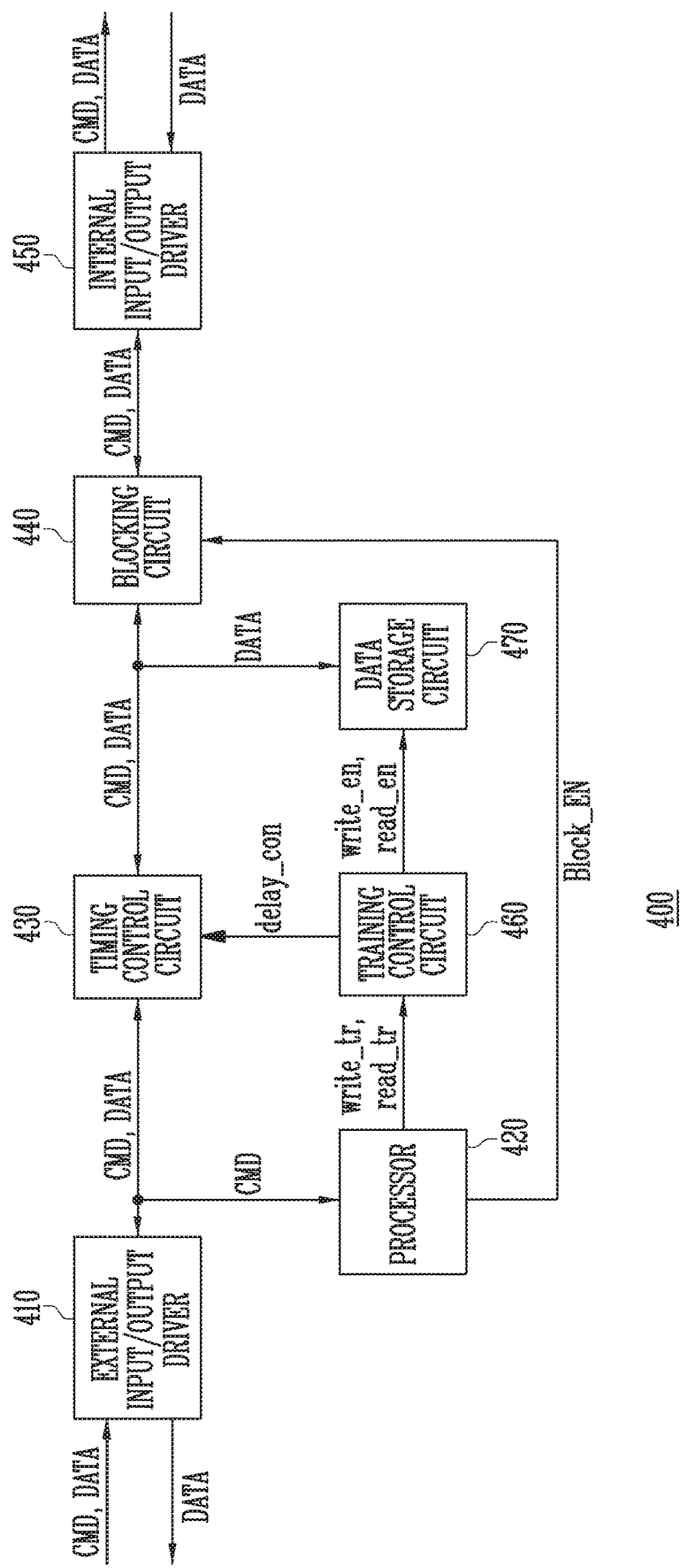
FIG. 2 is a block diagram describing a configuration of an interface circuit of FIG. 1.

FIG. 2 is a block diagram describing a configuration of the interface circuit of FIG. 1.

Referring to FIG. 2, the interface circuit 400 may include an external input/output driver 410, a processor 420, a timing control circuit 430, a blocking circuit 440, an internal input/output driver 450, a training control circuit 460, and a data storage circuit 470.

The external input/output driver 410 receives a command CMD and data DATA from the controller 1200 of FIG. 1 and transmits the command CMD and the data to the timing control circuit 430 during a write operation. In addition, the external input/output driver 410 transmits the received command CMD to the processor 420.

In addition, the external input/output driver 410 receives the data DATA from the timing control circuit 430 and transmits the data DATA to the controller 1200 of FIG. 1 during a read operation.

The processor 420 receives the command CMD from the external input/output driver 410 and parses the received command CMD. As a result of parsing, when the received command CMD is determined as a command CMD to be transmitted to the semiconductor memory 100 in correspondence with an internal operation of the semiconductor memory 100 of FIG. 1, the processor 420 deactivates and outputs a blocking enable signal Block_EN. As a result of parsing, when the received command CMD corresponds to the training operation of the interface circuit 400, a write training signal write_tr or a read training signal read_tr is generated and output, or the write training signal write_tr and the read training signal read_tr are sequentially generated and output. At this time, the processor 420 activates and outputs the blocking enable signal Block_EN.

The processor 420 may include a register (not shown), and a plurality of addresses may be stored in the register. The plurality of addresses include an address corresponding to the semiconductor memory 100 and an address corresponding to the interface circuit 400. The processor 420 may compare the address included in the command CMD with the address stored in the register during the parsing operation to determine whether the received command CMD corresponds to the semiconductor memory 100 or the interface circuit 400.

The timing control circuit 430 receives and rearranges timings of the command CMD and the data DATA from the external input/output driver 410 and outputs the rearranged command CMD and data DATA to the blocking circuit 440 during the write operation of the semiconductor memory. The timing control circuit 430 rearranges the timing of the data DATA received from the external input/output driver 410 and outputs the data to the data storage circuit 470 during the write training operation of the interface circuit 400. The timing control circuit 430 rearranges the timing of the data DATA received from the blocking circuit 440 and outputs the data to the external input/output driver 410 during the read operation of the semiconductor memory. The timing control circuit 430 rearranges the timing of the data DATA received from the data storage circuit 470 and outputs the data to the external input/output driver 410 during the read training operation of the interface circuit 400.

The timing control circuit 430 may delay and output the received data DATA in response to a delay control signal delay_con received from the training control circuit 460.

The blocking circuit 440 transmits the command CMD and data DATA received from the timing control circuit 430 to the internal input/output driver 450 or transmits the data DATA received from the internal input/output driver 450 to the timing control circuit 430. The blocking circuit 440 performs a blocking operation in response to the blocking enable signal Block_EN activated during the training operation of the interface circuit 400 so that the command CMD and the data DATA received from the timing control circuit 430 are not transmitted to the internal input/output driver 450.

The internal input/output driver 450 receives the command CMD and the data DATA through the blocking circuit 440 and transmits the command CMD and the data DATA to the semiconductor memory 100 of FIG. 1, or transmits the data DATA received from the semiconductor memory 100 to the blocking circuit 440.

The training control circuit 460 controls the write operation and the read operation of the data storage circuit 470 during the training operation of the interface circuit 400. The training control circuit 460 determines the amount of mismatch between the timings of the internal clock and the data of the interface circuit 400 according to a write operation result of the data storage circuit 470, and generates the delay control signal delay_con for controlling the delay time of the data DATA received from the external input/output driver 410 during the write operation of the semiconductor memory 100. In addition, the training control circuit 460 determines the amount of mismatch between the timings of the internal clock and the data of the interface circuit 400 according to a read operation result of the data storage circuit 470 and generates the delay control signal delay_con for controlling the delay time of the data DATA output to the external input/output driver 410 during the read operation of the semiconductor memory 100.

For example, the training control circuit 460 generates and output a write enable signal write_en for controlling the write operation of the data storage circuit 470 in response to the write training signal write_tr received from the processor 420 during the write training operation of the interface circuit 400. The training control circuit 460 generates and outputs a read enable signal read_en for controlling the read operation of the data storage circuit 470 in response to the read training signal read_tr received from the processor 420 during the read training operation of the interface circuit 400.

The data storage circuit 470 may store the training data therein or may read and output the stored training data therefrom during the training operation of the interface circuit 400. The data storage circuit 470 may store the training data therein in response to the write enable signal write_en and may read and output the stored training data therefrom in response to the read enable signal read_en.

Figure 3:
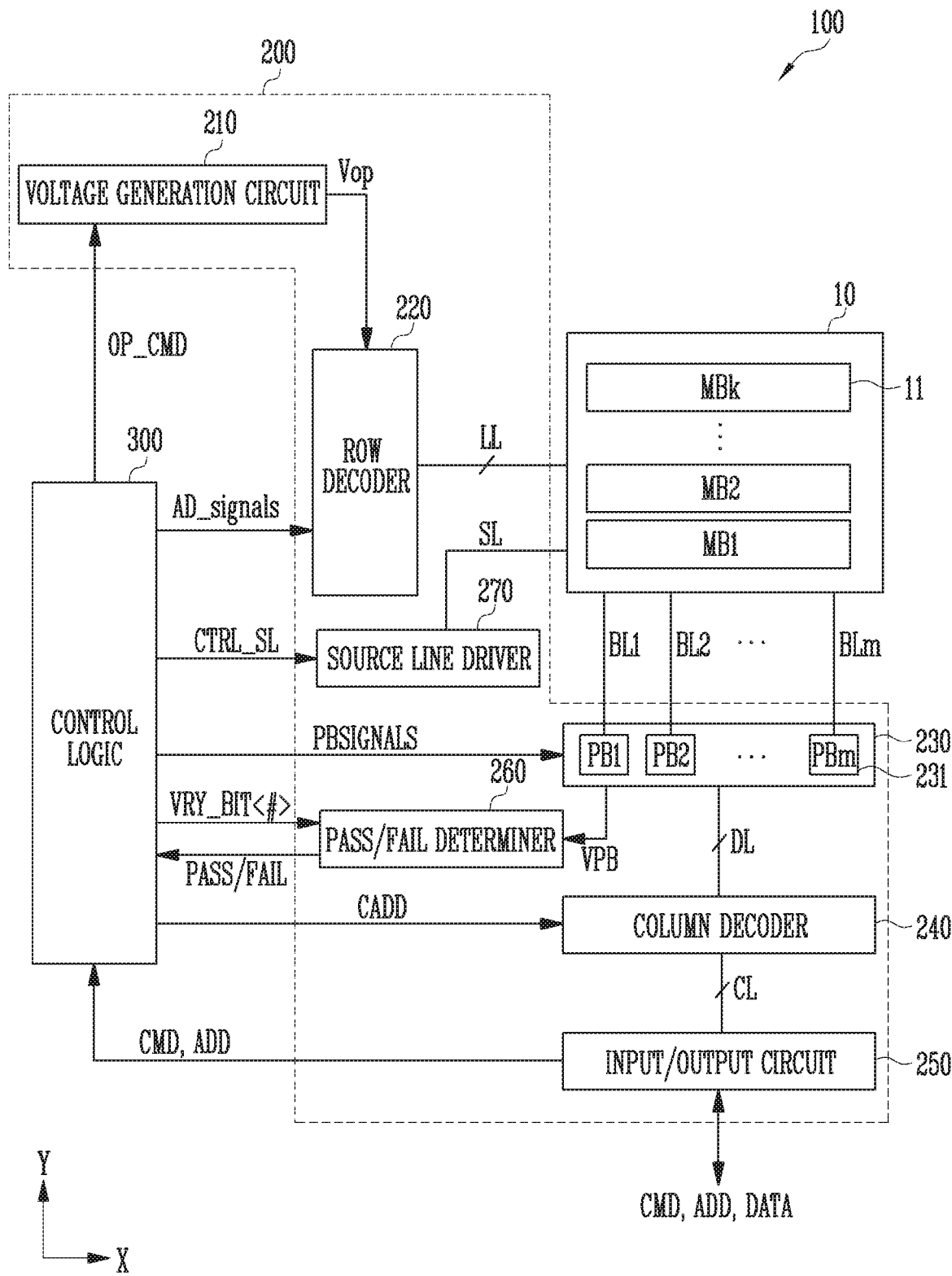
FIG. 3 is a diagram describing a semiconductor memory of FIG. 1.

FIG. 3 is a diagram describing the semiconductor memory 100 of FIG. 1.

Referring to FIG. 3, the semiconductor memory 100 may include a memory cell array 10 in which data is stored. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 that controls the peripheral circuits 200 according to the command that is generated in the controller 1200 of FIG. 1 and received through the interface circuit 400 of FIG. 1.

The memory cell array 10 may include a plurality of memory blocks MB1 to MBk and 11 (k is a positive integer). Some memory blocks (for example, MB1) of the plurality of memory blocks 11 may store the system data, and the remaining memory blocks MB2 to MBk may store the normal data. Local lines LL and bit lines BL1 to BLm (m is a positive integer) may be connected to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk 11, respectively, and the bit lines BL1 to BLm may be commonly connected to the memory blocks MB1 to MBk 11. The memory blocks MB1 to MBk 11 may be implemented in a two-dimensional or three-dimensional structure. For example, the memory cells may be arranged in a direction parallel to a substrate in the memory block 11 of the two-dimensional structure. For example, the memory cells may be stacked in a direction perpendicular to the substrate in the memory block 11 of the three-dimensional structure.

The peripheral circuits 200 may be configured to perform the program, read, and erase operations of the memory block 11 selected under control of the control logic 300. For example, the peripheral circuits 200 may include a voltage generation circuit 210, a row decoder 220, a page buffer group 230, a column decoder 240, an input/output circuit 250, a pass/fail determiner (pass/fail check circuit) 260, and a source line driver 270.

The voltage generation circuit 210 may generate various operation voltages Vop used in the program, read, and erase operations in response to an operation signal OP_CMD. In addition, the voltage generation circuit 210 may selectively discharge the local lines LL in response to the operation signal OP_CMD. For example, the voltage generation circuit 210 may generate a program voltage, a verify voltage, a pass voltage, and a select transistor operation voltage under the control of the control logic 300.

The row decoder 220 may transmit the operation voltages Vop to the local lines LL connected to the selected memory block 11 in response to a row decoder control signals AD_signals1 and AD_signals2. For example, the row decoder 220 may selectively apply the operation voltages (for example, the program voltage, the verify voltage, the pass voltage, and the like) generated in the voltage generation circuit 210 in response to the row decoder control signals AD_signals to the word lines among the local lines LL.

The row decoder 220 applies the program voltage generated in the voltage generation circuit 210 to the selected word line among the local lines LL and applies the pass voltage generated in the voltage generation circuit 210 to the remaining unselected word lines, in response to the row decoder control signals AD_signals during a program voltage application operation. In addition, the row decoder 220 applies the read voltage generated in the voltage generation circuit 210 to the selected word line among the local lines LL and applies the pass voltage generated in the voltage generation circuit 210 to the remaining unselected word lines, in response to the row decoder control signals AD_signals during a read operation.

The page buffer group 230 may include a plurality of page buffers PB1 to PBm 231 connected to the bit lines BL1 to BLm. The page buffers PB1 to PBm 231 may operate in response to page buffer control signals PBSIGNALS. For example, the page buffers PB1 to PBm 231 may temporarily store data to be programmed during a program operation or sense a voltage or a current of the bit lines BL1 to BLm during the read operation or the verify operation.

The column decoder 240 may transfer data between the input/output circuit 250 and the page buffer group 230 in response to a column address CADD. For example, the column decoder 240 may exchange data with the page buffers 231 through data lines DL, or may exchange data with the input/output circuit 250 through column lines CL.

The input/output circuit 250 may transfer the command CMD and the address ADD received from the controller 1200 of FIG. 1 to the control logic 300 or may exchange the data DATA with the column decoder 240.

The pass/fail determiner 260 may generate a reference current in response to a permission bit VRY_BIT<#> during the read operation or the verify operation, compare a sensing voltage VPB received from the page buffer group 230 with a reference voltage generated by the reference current, and output a pass signal PASS or a fail signal FAIL.

The source line driver 270 may be connected to the memory cell included in the memory cell array 10 through a source line SL and may control a voltage applied to the source line SL. The source line driver 270 may receive a source line control signal CTRL_SL from the control logic 300 and may control a source line voltage applied to the source line SL based on the source line control signal CTRL_SL.

The control logic 300 may output the operation signal OP_CMD, the row decoder control signal AD_signals, the page buffer control signals PBSIGNALS, and the permission bit VRY_BIT<#> in response to the command CMD and the address ADD to control the peripheral circuits 200. In addition, the control logic 300 may determine whether the verify operation is passed or failed in response to the pass signal PASS or the fail signal FAIL.

Figure 4:
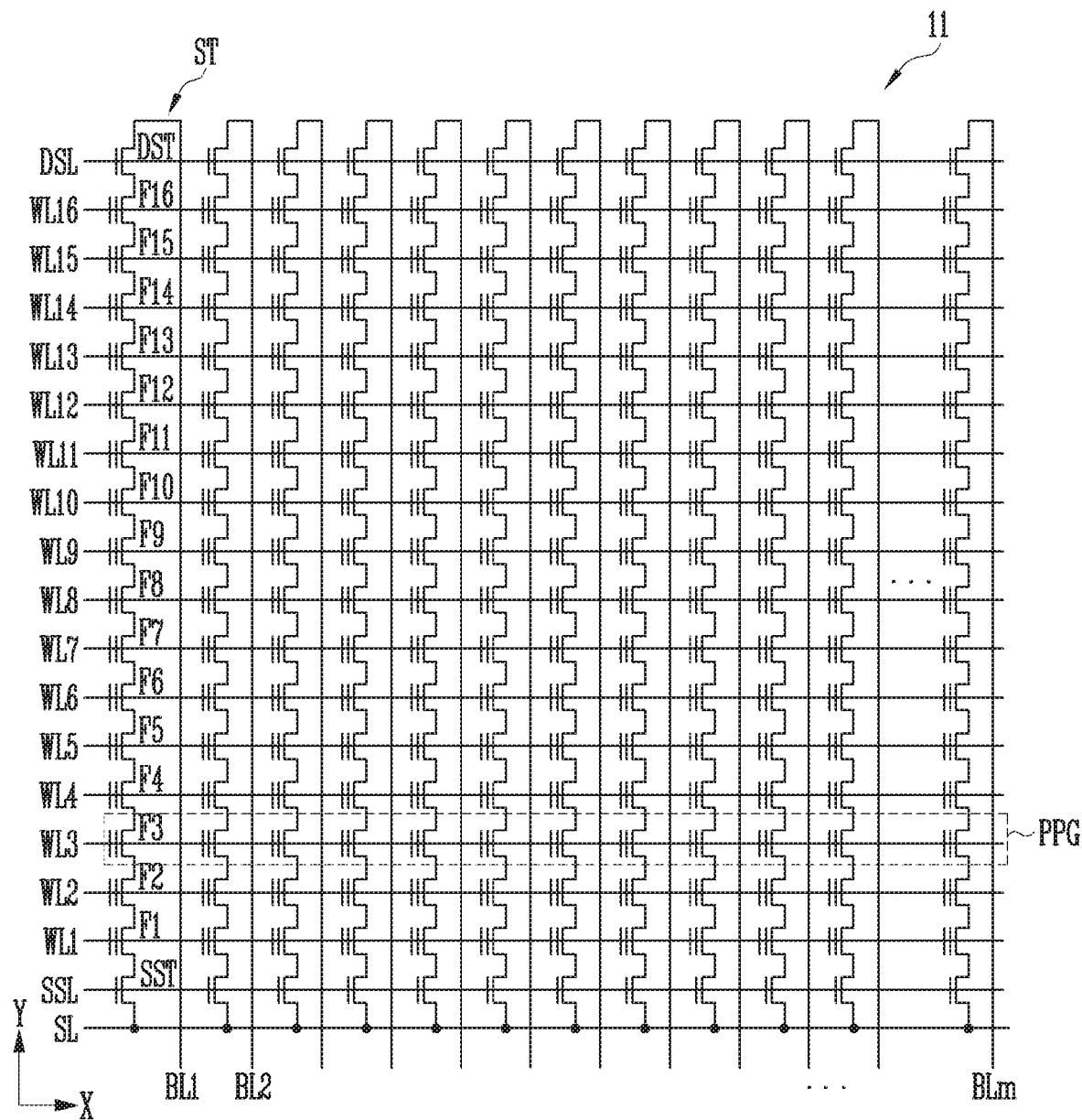
FIG. 4 is a diagram describing a memory block of FIG. 3.

FIG. 4 is a diagram describing the memory block of FIG. 3.

Referring to FIG. 4, the memory block 11 may be connected to the plurality of word lines arranged in parallel with each other between the first select line and the second select line. Here, the first select line may be a source select line SSL, and the second select line may be a drain select line DSL. More specifically, the memory block 11 may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be described in detail, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16. Furthermore, a number of memory cells other than that shown in the figure may be used.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings ST may be referred to as a physical page PPG. Therefore, the memory block 11 may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 5:
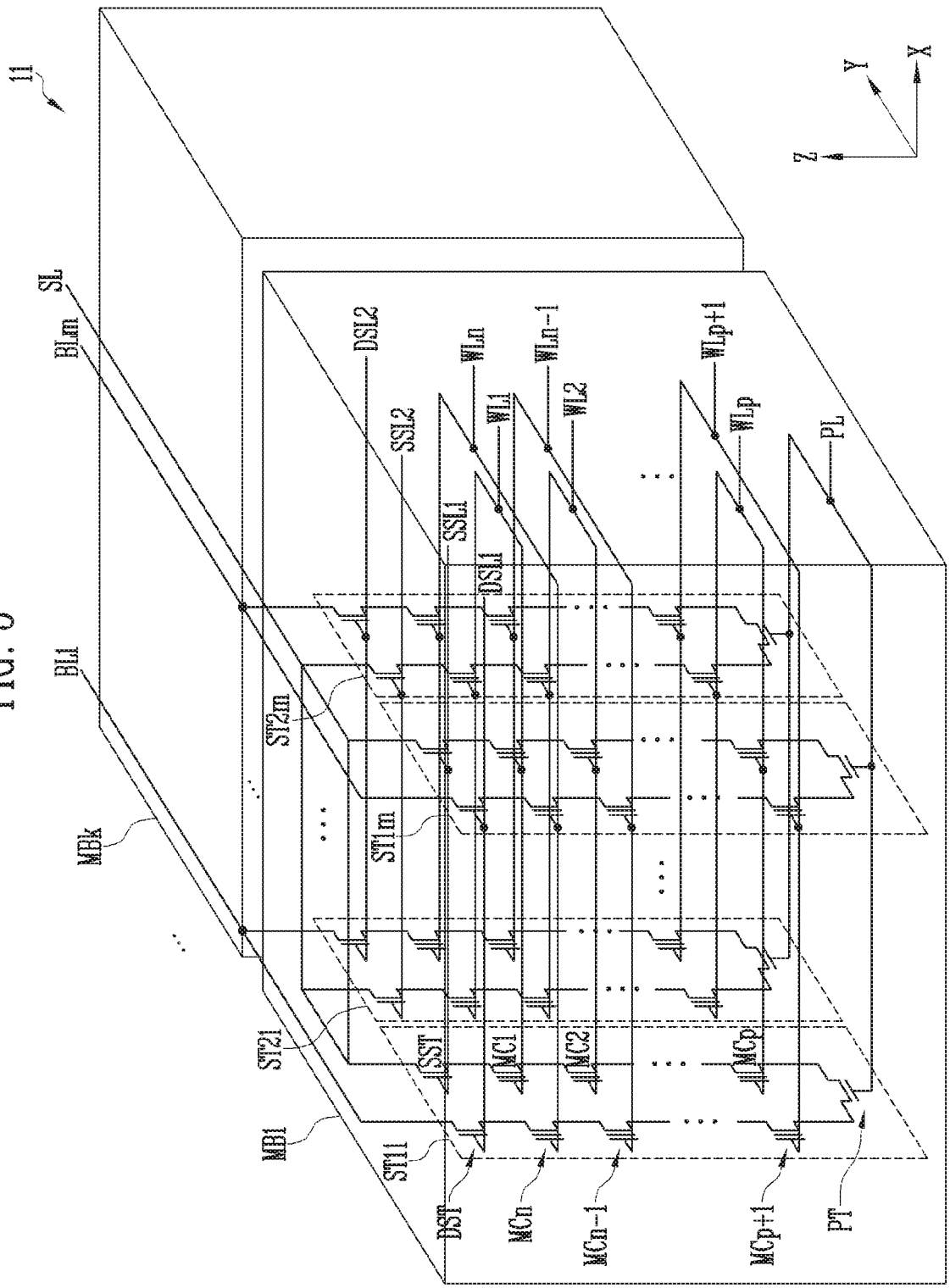
FIG. 5 is a diagram describing an embodiment of a memory block configured in three-dimensions.

FIG. 5 is a diagram describing an embodiment of a memory block configured in three-dimensions.

Referring to FIG. 5, the memory cell array 10 may include a plurality of memory blocks MB1 to MBk. The memory block 11 may include a plurality of strings ST11 to ST1*m* and ST21 to ST2*m*. As an embodiment, each of the plurality of strings ST11 to ST1*m* and ST21 to ST2*m* may be formed in a U shape. In the first memory block MB1, m strings may be arranged in a row direction (X direction). In FIG. 5, two strings are arranged in a column direction (Y direction), but this is for convenience of description, and three or more strings may be arranged in the column direction (Y direction).

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for proving the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

As an embodiment, the source select transistors of the strings arranged in the same row may be connected to the source select line extending in the row direction, and the source select transistors of the strings arranged in different rows may be connected to different source select lines. In FIG. 5, the source select transistors of the strings ST11 to ST1m of a first row may be connected to a first source select line SSL1. The source select transistors of the strings ST21 to ST2m of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to a pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 5, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 of the strings ST11 to ST1m of the first row may configure one page. The memory cells connected to the first word line WL1 of the strings ST21 to ST2m of the second row may configure another page. When one of the drain select lines DSL1 and DSL2 is selected, the strings arranged in one row direction are selected. When one of the word lines WL1 to WLn is selected, one page is selected among the selected strings.

Figure 6:
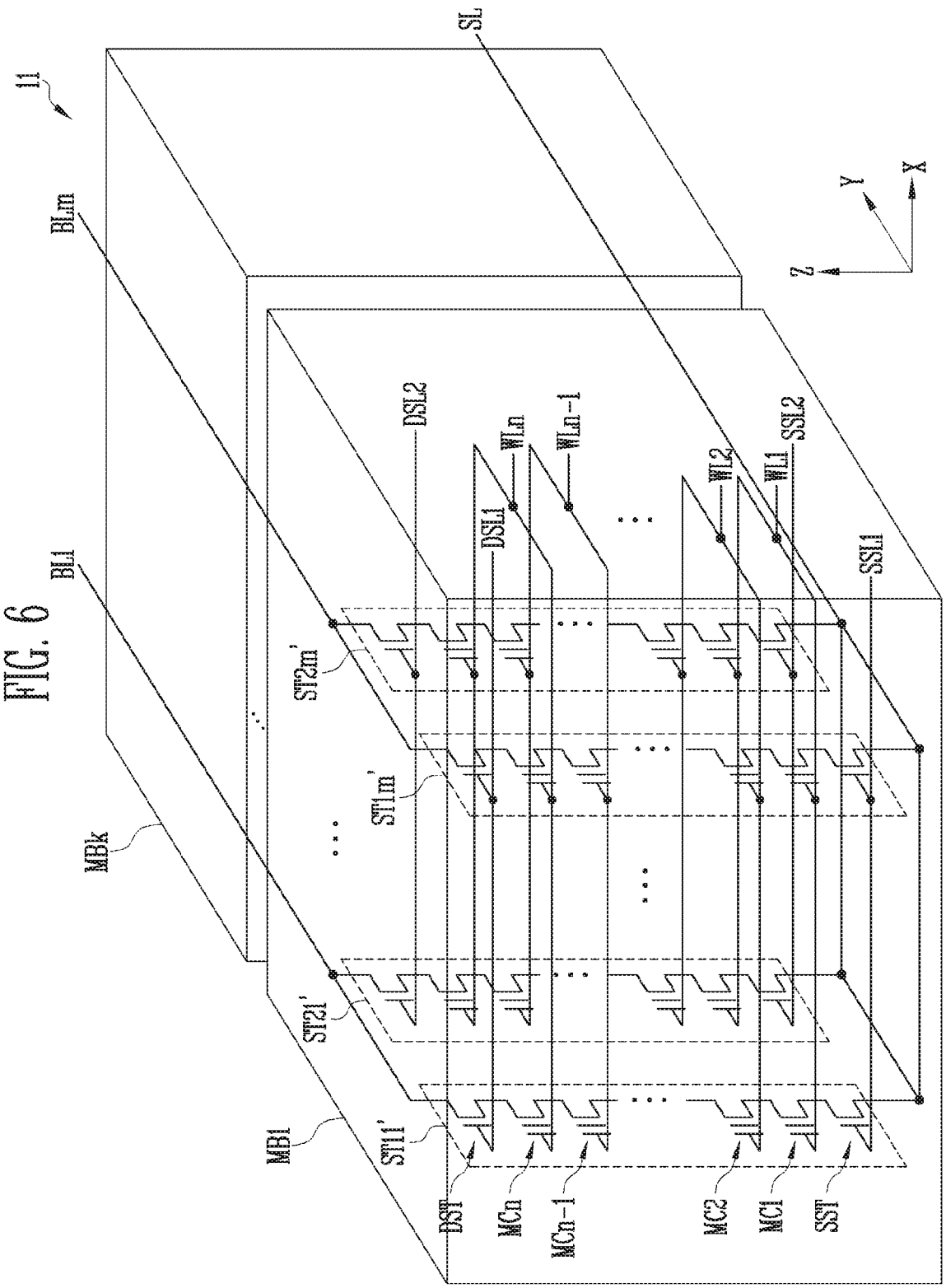
FIG. 6 is a diagram describing another embodiment of a memory block configured in three-dimensions.

FIG. 6 is a diagram describing another embodiment of a memory block configured in a three-dimension.

Referring to FIG. 6, the memory cell array 10 may include a plurality of memory blocks MB1 to MBk. The memory block 11 may include a plurality of strings ST11' to ST1m' and ST21' to ST2m'. Each of the plurality of strings ST11' to ST1m' and ST21' to ST2m' may extend along the vertical direction (Z direction). In the memory block 11, m strings may be arranged in the row direction (X direction). In FIG. 6, two strings are arranged in the column direction (Y direction), but this is for convenience of description, and three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to the first source select line SSL1. The source select transistors of the strings ST21' to ST2m' arranged in the second row may be connected to the second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

As an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11 may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings ST11' to ST1m' of the first row may be connected to the first drain select line DSL1. The drain select transistors DST of the strings ST21' to ST2m' of the second row may be connected to the second drain select line DSL2.

Figure 7:
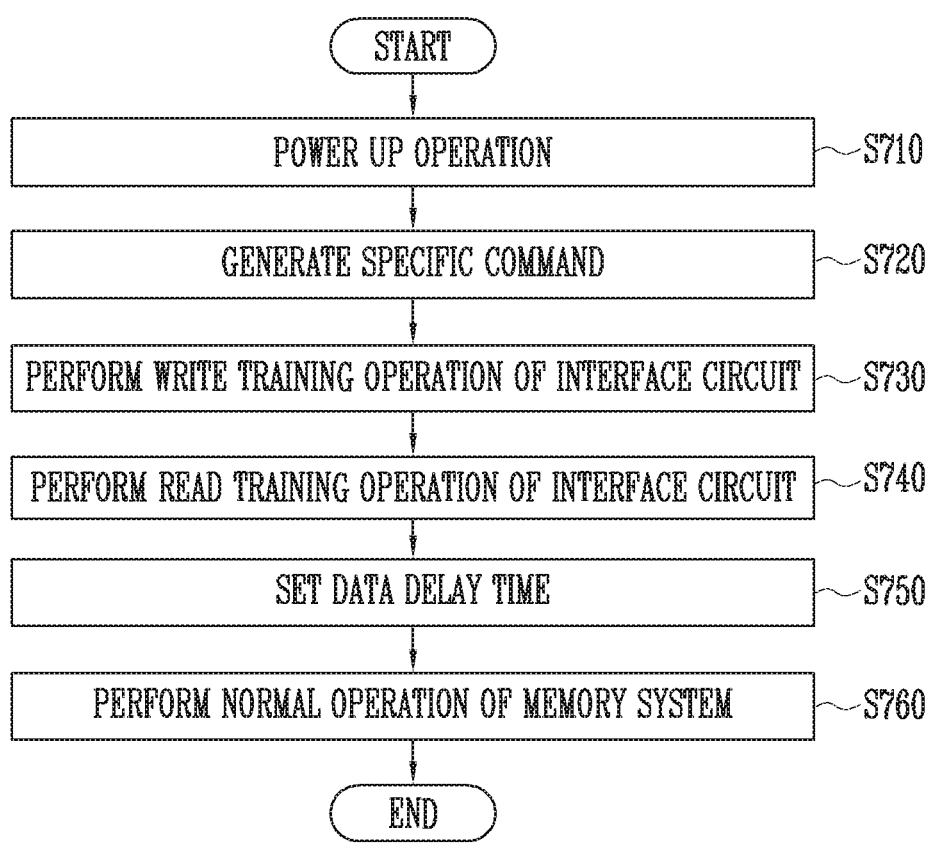
FIG. 7 is a flowchart describing an operation of a memory system according to an embodiment of the present disclosure.

FIG. 7 is a flowchart describing an operation of a memory system according to an embodiment of the present disclosure.

The operation of the memory system according to the embodiment of the present disclosure will be described with reference to FIGS. 1 to 7 as follows.

When a power voltage is applied to the memory system 1000 and a power up operation is performed (S710), the controller 1200 generates the specific command for instructing the training operation of the interface circuit 400 after the power up operation (S720). The specific command may comprise the command corresponding to the write training operation of the interface circuit 400 and the command corresponding to the read training operation of the interface circuit 400. In addition, the specific command may include the address corresponding to the interface circuit 400.

The controller 1200 outputs the specific command CMD and the data DATA for the write training operation to the interface circuit 400 of the memory device 1100. The data DATA for the write training operation may be data having a specific pattern.

The interface circuit 400 receives the specific command CMD and the data DATA and performs the write training operation of the interface circuit 400 (S730).

A detailed operation of the interface circuit 400 during the write training operation of the interface circuit 400 will be described as follows.

The external input/output driver 410 receives the command CMD and the data DATA from the controller 1200, and transmits the command CMD and the data DATA to the timing control circuit 430. In addition, the external input/output driver 410 transmits the received command CMD to the processor 420.

The processor 420 receives the command CMD from the external input/output driver 410 and parses the received command CMD. As a result of parsing, when the received command CMD corresponds to the training operation of the interface circuit 400, the write training signal write_tr is generated and output. At this time, the processor 420 activates and outputs the blocking enable signal Block_EN. The processor 420 may compare the address included in the command CMD with the address stored in the register during the parsing operation to determine whether the received command CMD corresponds to the semiconductor memory 100 or the interface circuit 400.

The timing control circuit 430 receives the command CMD and the data DATA from the external input/output driver 410, rearranges the timings of the received command CMD and data DATA, and outputs the rearranged command CMD and data DATA to the blocking circuit 440. In addition, the timing control circuit 430 outputs the rearranged data DATA to the data storage circuit 470.

The blocking circuit 440 performs the blocking operation so that the command CMD and the data DATA received from the timing control circuit 430 are not transmitted to the internal input/output driver 450 in response to the blocking enable signal Block_EN.

The training control circuit 460 generates and outputs the write enable signal write_en for controlling the write operation of the data storage circuit 470 in response to the write training signal write_tr received from the processor 420. The data storage circuit 470 receives and stores the data output from the timing control circuit 430 in response to the write enable signal write_en.

After the write training operation, the interface circuit 400 performs the read training operation (S740).

A detailed operation of the interface circuit 400 during the read training operation of the interface circuit 400 will be described as follows.

When the write training operation (S730) is ended, the processor 420 generates and outputs the read training signal read_tr. At this time, the processor 420 controls the blocking enable signal Block_EN to maintain the activation state.

The training control circuit 460 generates and outputs the read enable signal read_en for controlling the read operation of the data storage circuit 470 in response to the read training signal read_tr received from the processor 420. The data storage circuit 470 performs the data read operation in response to the read enable signal read_en and outputs the read data to the timing control circuit 430.

The timing control circuit 430 rearranges the timing of the data received from the data storage circuit 470 and outputs the data to the external input/output driver 410, and the external input/output driver 410 outputs the data DATA received from the timing control circuit 430 to the controller 1200.

When the write training operation (S730) and the read training operation (S740) of the interface circuit 400 are finished, the training control circuit 460 determines the amount of mismatch between the timings of the internal clock and the data of the interface circuit 400 during the write training operation to set the delay time of the data DATA received from the external input/output driver 410 during the write operation, and determines the amount of mismatch between the timings of the internal clock and the data of the interface circuit 400 during the read training operation to set the delay time of the data DATA output to the external input/output driver 410 during the read operation (S750).

Thereafter, a normal operation of the memory system 1000 is performed (S760).

The host 1300 outputs the host command Host_CMD and the data DATA corresponding to a normal write operation to the controller 1200 during the normal write operation, and the controller 1200 generates the command CMD corresponding to the host command Host_CMD and transmits the command CMD corresponding to the host command Host_CMD to the memory device 1100 together with the data DATA.

The interface circuit 400 of the memory device 1100 receives and rearranges the timings of the command CMD and the data DATA, and transmits the rearranged command CMD and data DATA to the semiconductor memory 100. The timing control circuit 430 of the interface circuit 400 may delay and output the received data DATA in response to the delay control signal delay_con received from the training control circuit 460 during an operation of transmitting the command CMD and the data DATA from the interface circuit 400. The delay control signal delay_con may be generated based on the delay time set according to the amount of mismatch between the data DATA and the internal clock obtained as a result of the write training operation of the interface circuit 400.

The semiconductor memory 100 performs the normal write operation in response to the command CMD and the data DATA received through the interface circuit 400.

During a normal read operation, the host 1300 outputs the host command Host_CMD corresponding to the normal read operation to the controller 1200, and the controller 1200 generates the command CMD corresponding to the host command Host_CMD and transmits the command CMD corresponding to the host command Host_CMD to the memory device 1100.

The interface circuit 400 of the memory device 1100 receives the command CMD and transmits the command CMD to the semiconductor memory 100, and the semiconductor memory 100 performs the normal read operation in response to the received command CMD.

The interface circuit 400 receives and rearranges the timing of the data DATA read as a result of the normal read operation of the semiconductor memory 100 and transmits the rearranged data DATA to the controller 1200. The timing control circuit 430 of the interface circuit 400 may delay and output the received data DATA in response to the delay control signal delay_con received from the training control circuit 460 during an operation of transmitting the data DATA of the interface circuit 400. The delay control signal delay_con may be generated based on the delay time set according to the amount of mismatch between the data DATA and the internal clock obtained as a result of the read training operation of the interface circuit 400.

During the above-described normal operation, for example, the normal write operation and the normal read operation of the semiconductor memory 100, the blocking circuit 440 of the interface circuit 400 deactivates the blocking operation in response to the deactivated blocking enable signal Block_EN.

As described above, according to the embodiment of the present disclosure, the training operation of the interface circuit 400 may be performed in response to the specific command corresponding to the interface circuit 400. In addition, malfunction of the semiconductor memory 100 may be prevented by blocking transfer of the first command to the semiconductor memory 100 during the training operation of the interface circuit 400.

In the embodiment of the present disclosure, the training operation of the interface circuit is performed after the power up operation, but the present disclosure is not limited thereto. For example, when the training operation of the interface circuit is requested from the host, the specific command may be generated in response to the host command, and the interface circuit may perform the training operation in response to the specific command.

In addition, in the embodiment of the present disclosure, the delay time of the data is set according to the result of the write training operation and the read training operation during the training operation of the interface circuit. However, in order to match the timings of the internal clock and the data, a delay time of the internal clock may be controlled instead of a delay time of the data.

Figure 8:
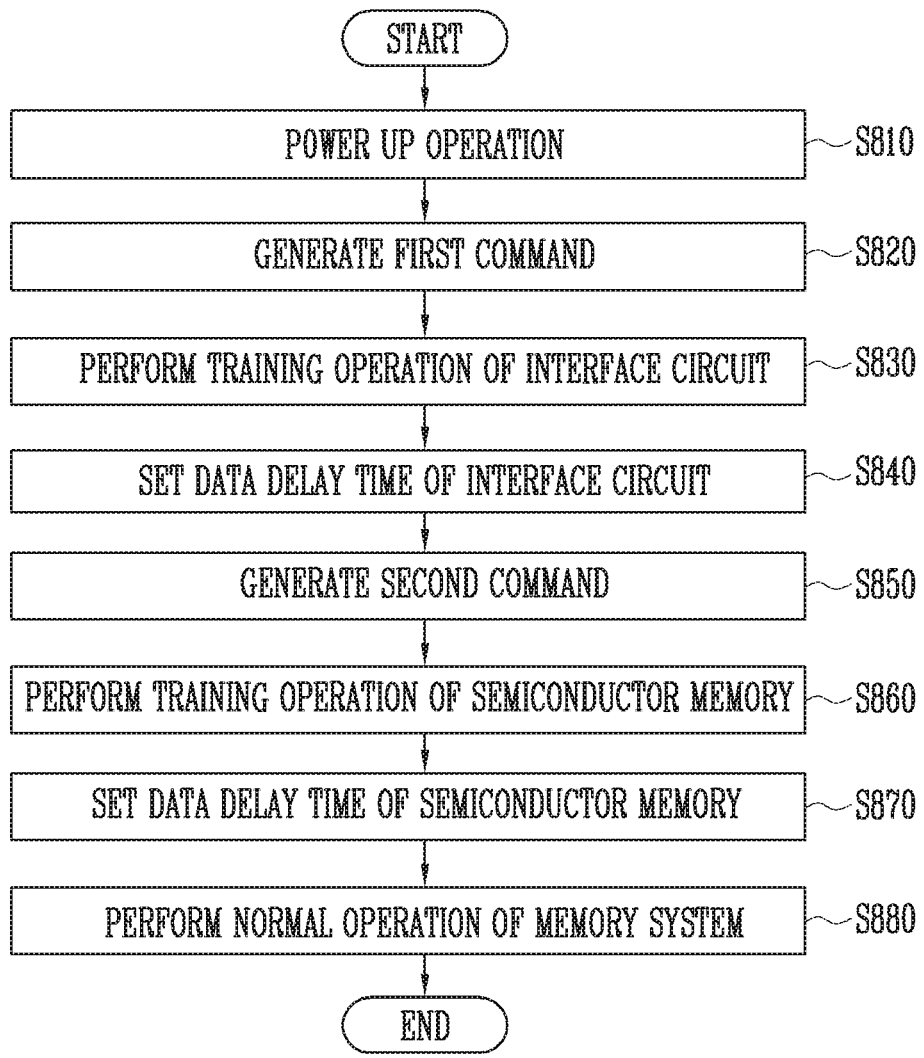
FIG. 8 is a flowchart describing an operation of a memory system according to another embodiment of the present disclosure.

FIG. 8 is a flowchart describing an operation of a memory system according to another embodiment of the present disclosure.

The operation of the memory system according to the embodiment of the present disclosure will be described with reference to FIGS. 1, 2, and 8 as follows.

When a power voltage is applied to the memory system 1000 and a power up operation is performed (S810), the controller 1200 generates the first command for instructing the training operation of the interface circuit 400 after the power up operation (S820). The first command may comprise the command corresponding to the write training operation of the interface circuit 400 and the command corresponding to the read training operation of the interface circuit 400. In addition, the first command may include the address corresponding to the interface circuit 400.

The controller 1200 outputs the first command CMD and the data DATA for the write training operation to the interface circuit 400 of the memory device 1100. The data DATA for the write training operation may be data having a specific pattern.

The interface circuit 400 receives the first command CMD and the data DATA and performs the training operation of the interface circuit 400 (S830). The training operation of the interface circuit 400 may include the write training operation and the read training operation.

A detailed operation of the interface circuit 400 during the write training operation of the interface circuit 400 will be described as follows.

The external input/output driver 410 receives the first command CMD and the data DATA from the controller 1200 and transmits the first command CMD and the data DATA to the timing control circuit 430. In addition, the external input/output driver 410 transmits the received command CMD to the processor 420.

The processor 420 receives the first command CMD from the external input/output driver 410 and parses the received command CMD. As a result of parsing, when the received first command CMD corresponds to the training operation of the interface circuit 400, the write training signal write_tr is generated and output. At this time, the processor 420 activates and outputs the blocking enable signal Block_EN. The processor 420 may compare the address included in the first command CMD with the address stored in the register during the parsing operation to determine whether the received first command CMD corresponds to the semiconductor memory 100 or the interface circuit 400.

The timing control circuit 430 receives the first command CMD and the data DATA from the external input/output driver 410, rearranges the timings of the received first command CMD and data DATA, and outputs the rearranged command CMD and data DATA to the blocking circuit 440. In addition, the timing control circuit 430 outputs the rearranged data DATA to the data storage circuit 470.

The blocking circuit 440 performs the blocking operation so that the first command CMD and the data DATA received from the timing control circuit 430 are not transmitted to the internal input/output driver 450 in response to the blocking enable signal Block_EN.

The training control circuit 460 generates and outputs the write enable signal write_en for controlling the write operation of the data storage circuit 470 in response to the write training signal write_tr received from the processor 420. The data storage circuit 470 receives and stores the data output from the timing control circuit 430 in response to the write enable signal write_en.

After the write training operation, the interface circuit 400 performs the read training operation.

A detailed operation of the interface circuit 400 during the read training operation of the interface circuit 400 will be described as follows.

When the write training operation is ended, the processor 420 generates and outputs the read training signal write_tr. At this time, the processor 420 controls the blocking enable signal Block_EN to maintain the activation state.

The training control circuit 460 generates and outputs the read enable signal read_en for controlling the read operation of the data storage circuit 470 in response to the read training signal read_tr received from the processor 420. The data storage circuit 470 performs the data read operation in response to the read enable signal read_en and outputs the read data to the timing control circuit 430.

The timing control circuit 430 rearranges the timing of the data received from the data storage circuit 470 and outputs the data to the external input/output driver 410, and the external input/output driver 410 outputs the data DATA received from the timing control circuit 430 to the controller 1200.

When the training operation (S830) of the interface circuit 400 described above is finished, the training control circuit 460 determines the amount of mismatch between the timings of the internal clock and the data of the interface circuit 400 during the write training operation to set the delay time of the data DATA received from the external input/output driver 410 during the write operation, and determines the amount of mismatch between the timings of the internal clock and the data of the interface circuit 400 during the read training operation to set the delay time of the data DATA output to the external input/output driver 410 during the read operation (S840).

The controller 1200 generates the second command for instructing the training operation of the semiconductor memory 100 (S850). The second command may comprise the command corresponding to the write training operation of the semiconductor memory 100 and the command corresponding to the read training operation of the semiconductor memory 100. In addition, the second command may include the address corresponding to the semiconductor memory 100.

The controller 1200 outputs the second command CMD and the data DATA for the write training operation to the interface circuit 400 of the memory device 1100. The data DATA for the write training operation may be data having a specific pattern.

The interface circuit 400 receives the second command CMD and the data DATA and transmits the second command CMD and the data DATA to the semiconductor memory 100. At this time, the timing control circuit 430 of the interface circuit 400 may delay and output the received data DATA in response to the delay control signal delay_con received from the training control circuit 460. The delay control signal delay_con may be generated based on the delay time set according to the amount of mismatch between the data DATA and the internal clock obtained as a result of the write training operation of the interface circuit 400.

The semiconductor memory 100 performs the training operation of the semiconductor memory 100 based on the second command CMD and the data DATA received through the interface circuit 400 (S860). The training operation of the semiconductor memory 100 may include the write training operation and the read training operation. The training operation of the semiconductor memory 100 may be performed by the training control circuit 500 included in the semiconductor memory 100.

The training control circuit 500 sets the delay time of the data received during the write operation of the semiconductor memory 100 and the delay time of the data output during the read operation according to the result of the training operation of the semiconductor memory 100 (S870). For example, the training control circuit 500 may determine the amount of mismatch between the timings of data received and programmed during the write training operation of the semiconductor memory 100 and the internal clock of the semiconductor memory 100 to set the delay time during the write operation of the semiconductor memory 100 and may determine the amount of mismatch between the timings of data output to the interface circuit 400 during the read training operation of the semiconductor memory 100 and the internal clock of the semiconductor memory 100 to set the delay time during the read operation of the semiconductor memory 100.

Thereafter, the normal operation of the memory system 1000 is performed (S880).

The host 1300 outputs the host command Host_CMD and the data DATA corresponding to a normal write operation to the controller 1200 during the normal write operation. The controller 1200 generates the command CMD corresponding to the host command Host_CMD and transmits the command CMD corresponding to the host command Host_CMD to the memory device 1100 together with the data DATA.

The interface circuit 400 of the memory device 1100 receives and rearranges the timings of the command CMD and the data DATA, and transmits the rearranged command CMD and data DATA to the semiconductor memory 100. The timing control circuit 430 of the interface circuit 400 may delay and output the received data DATA in response to the delay control signal delay_con received from the training control circuit 460 during an operation of transmitting the command CMD and the data DATA of the interface circuit 400. The delay control signal delay_con may be generated based on the delay time set according to the amount of mismatch between the data DATA and the internal clock obtained as a result of the write training operation of the interface circuit 400. The semiconductor memory 100 may receive the command CMD and the data DATA received through the interface circuit 400 to perform the normal write operation, and may perform the normal write operation by delaying the received data DATA by the delay time set by the training control circuit 500.

During a normal read operation, the host 1300 outputs the host command Host_CMD corresponding to the normal read operation to the controller 1200, and the controller 1200 generates the command CMD corresponding to the host command Host_CMD and transmits the command CMD corresponding to the host command Host_CMD to the memory device 1100.

The interface circuit 400 of the memory device 1100 receives the command CMD and transmits the command CMD to the semiconductor memory 100, and the semiconductor memory 100 performs the normal read operation in response to the received command CMD.

The semiconductor memory 100 may output the read data DATA to the interface circuit 400, and may output the read data DATA by delaying the delay time set by the training control circuit 500.

The interface circuit 400 rearranges the timing of the data DATA received from the semiconductor memory 100 and transmits the rearranged data DATA to the controller 1200. The timing control circuit 430 of the interface circuit 400 may delay and output the received data DATA in response to the delay control signal delay_con received from the training control circuit 460 during an operation of transmitting the data DATA of the interface circuit 400. The delay control signal delay_con may be generated based on the delay time set according to the amount of mismatch between the data DATA and the internal clock obtained as a result of the read training operation of the interface circuit 400.

During the above-described normal operation, for example, the normal write operation and the normal read operation of the semiconductor memory 100, the blocking circuit 440 of the interface circuit 400 deactivates the blocking operation in response to the deactivated blocking enable signal Block_EN.

As described above, according to the embodiment of the present disclosure, the training operation of the interface circuit 400 may be performed in response to the first command corresponding to the interface circuit 400, and the training operation of the semiconductor memory 100 may be performed in response to the second command corresponding to the semiconductor memory 100. In addition, malfunction of the semiconductor memory 100 may be prevented by blocking transfer of the first command to the semiconductor memory 100 during the training operation of the interface circuit 400.

In the embodiment of the present disclosure, the training operations of the interface circuit and the semiconductor memory are performed after the power up operation, but the present disclosure is not limited thereto. For example, when the training operation of the interface circuit or the semiconductor memory is requested from the host, the first command or the second command may be generated in response to the host command, and the interface circuit or the semiconductor memory may perform the training operation in response to the first command or the second command.

In addition, in the embodiment of the present disclosure, the delay time of the data is set according to the result of the write training operation and the read training operation during the training operation. However, in order to match the timings of the internal clock and the data, a delay time of the internal clock may be controlled instead of a delay time of the data.

Figure 9:
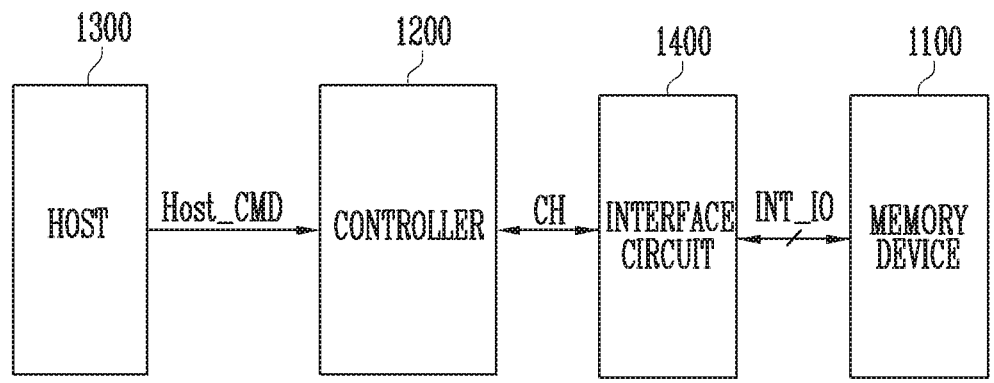
FIG. 9 is a diagram describing another embodiment of the memory system.

FIG. 9 is a diagram describing another embodiment of the memory system.

Referring to FIG. 9, a memory system 1000 includes a memory device 1100 in which data is stored, a controller 1200 that controls the memory device 1100 under control of a host 1300, and an interface circuit 1400 that mediates command and data transmission between the controller 1200 and the memory device 1100.

Differently from the memory system 1000 shown in FIG. 1, in the memory system 1000 shown in FIG. 9, the interface circuit 1400 may be disposed outside the memory device 1100 and may transmit the command and data to the memory device 1100 through an internal input/output line INT_IO.

The controller 1200 may generally control an operation of the memory system 1000 through the channel CH and control a data exchange between the host 1300 and the memory device 1100. The controller 1200 may control a plurality of semiconductor memories included in the memory device 1100 to program or read data according to a request of the host 1300. In addition, the controller 1200 may control to perform the training operation of the interface circuit 1400 according to the request of the host 1300 or to perform the training operation of the interface circuit 1400 after the power up operation. The controller 1200 may generate the command for controlling memory device 1100 or the interface circuit 1400 and transmit the command to the memory device 1100 in response to the host command Host_CMD corresponding to the request of host 1300. In addition, the controller 1200 may generate the command for controlling the training operation of the interface circuit 1400 and the memory device 1100 and transmit the command to the interface circuit 1400 and the memory device 1100 after the power up operation. At this time, the command for controlling the memory device 1100 includes the address corresponding to at least one of the plurality of semiconductor memories included in the memory device 1100, and the command for controlling the interface circuit 1400 includes the address corresponding to the interface circuit 1400.

A configuration of the interface circuit 1400 may be configured and operated as in the configuration of FIG. 2 described above. When the specific command received from the controller 1200 corresponds to the interface circuit 1400, the interface circuit 1400 may perform the write training operation and the read training operation in response to the received specific command, and the specific command is not transmitted to the memory device 1100 by the blocking operation. In addition, when the specific command received from the controller 1200 corresponds to the memory device 1100, the interface circuit 1400 transmits the received specific command to the memory device 1100 without the blocking operation.

Figure 10:
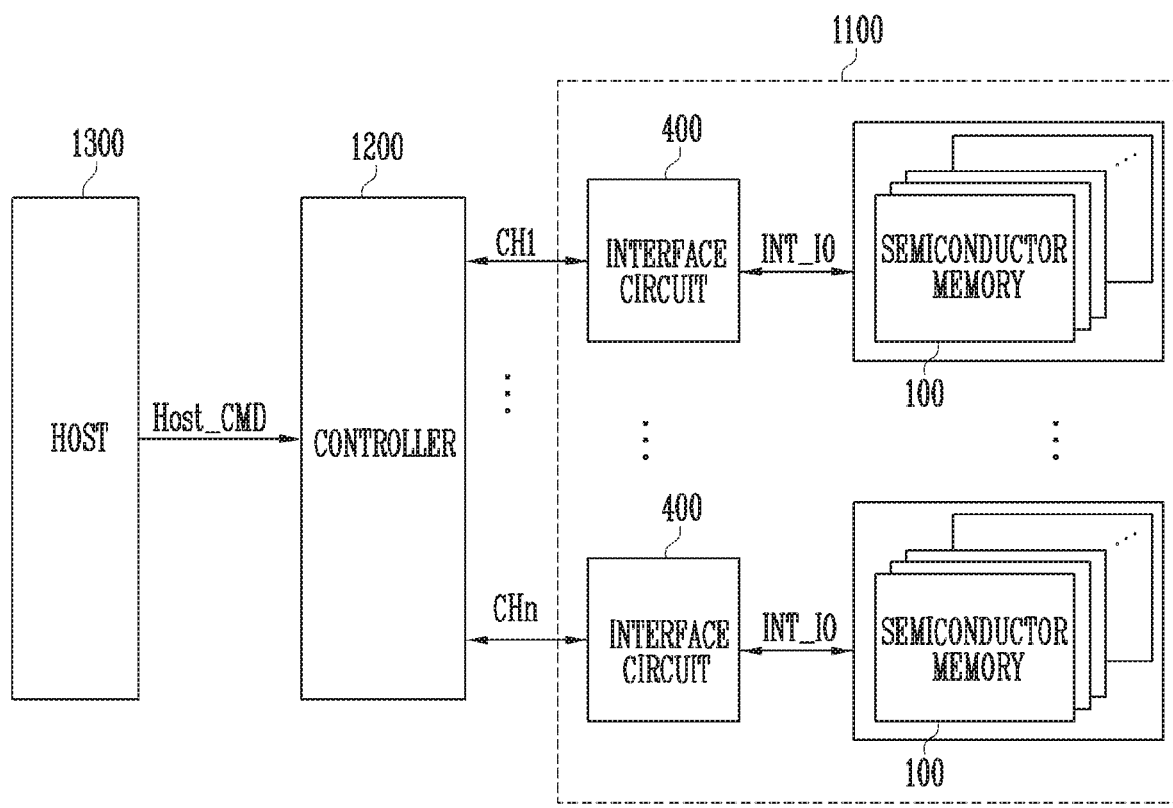
FIG. 10 is a diagram describing another embodiment of the memory system.

FIG. 10 is a diagram describing another embodiment of the memory system.

Referring to FIG. 10, a memory system 1000 includes a memory device 1100 and a controller 1200. The memory device 1100 includes a plurality of semiconductor memories 100 and a plurality of interface circuits 400. The plurality of semiconductor memories 100 may be divided into a plurality of groups, and each of the plurality of groups may be connected to one interface circuit 400 through an internal input/output line INT_IO.

In FIG. 10, a plurality of interface circuits 400 communicate with the controller 1200 through first to n-th channels CH1 to CHn, respectively. Therefore, the plurality of semiconductor memories 100 included in one group are configured to communicate with the controller 1200 through one interface circuit 400 and a common channel. The controller 1200 is configured to control the plurality of semiconductor memories 100 of the memory device 1100 through the plurality of channels CH1 to CHn.

The controller 1200 may generally control an operation of the memory system 1000 and control a data exchange between the host 1300 and the memory device 1100. The controller 1200 may control the plurality of semiconductor memories 100 included in the memory device 1100 to program or read data according to a request of the host 1300. In addition, the controller 1200 may perform the training operation of the interface circuits 400 included in the memory device 1100 or perform the training operation of the semiconductor memories 100 according to the request of the host 1300. In addition, the controller 1200 may perform the training operation of the interface circuits 400 or perform the training operation of the semiconductor memories 100 after the power up operation. The controller 1200 may generate the command for controlling the semiconductor memory 100 or the interface circuit 400 and transmit the command to the memory device 1100. At this time, the command for controlling the memory device 1100 includes the address corresponding to at least one of the plurality of semiconductor memories 100 included in the memory device 1100, and the command for controlling the interface circuits 400 includes the address corresponding to the interface circuits 400.

A configuration of the interface circuit 400 may be configured and operated as in the configuration of FIG. 2 described above. When the specific command received from the controller 1200 corresponds to the interface circuit 1400, the interface circuit 1400 may perform the write training operation and the read training operation in response to the received specific command, and the specific command is not transmitted to the memory device 1100 by the blocking operation. In addition, when the specific command received from the controller 1200 corresponds to the memory device 1100, the interface circuit 1400 transmits the received specific command to the memory device 1100 without the blocking operation.

The controller 1200 and the memory device 1100 may be integrated into one semiconductor device. In an embodiment, the controller 1200 and the memory device 1100 may be integrated into one semiconductor device to form a memory card. For example, the controller 1200 and the memory device 1100 may be integrated into one semiconductor device to form a memory card such as a PC card (personal computer memory card international association (PCMCIA)), a compact flash card (CF), a smart media card (SM, SMC), a memory stick, a multimedia card (MMC, RS-MMC, MMCmicro), an SD card (SD, miniSD, microSD, SDHC), and a universal flash memory (UFS).

The controller 1200 and the memory device 1100 may be integrated into one semiconductor device to form a semiconductor drive (solid state drive (SSD)). The semiconductor drive (SSD) includes a storage device configured to store data in a semiconductor memory. When the memory system 1000 is used as the semiconductor drive (SSD), an operation speed of the host 1300 connected to the memory system 1000 is dramatically improved.

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring telematics network, an RFID device, or one of various components configuring a computing system.

In an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), or a wafer-level fabricated package processed stack package (WSP).

Figure 11:
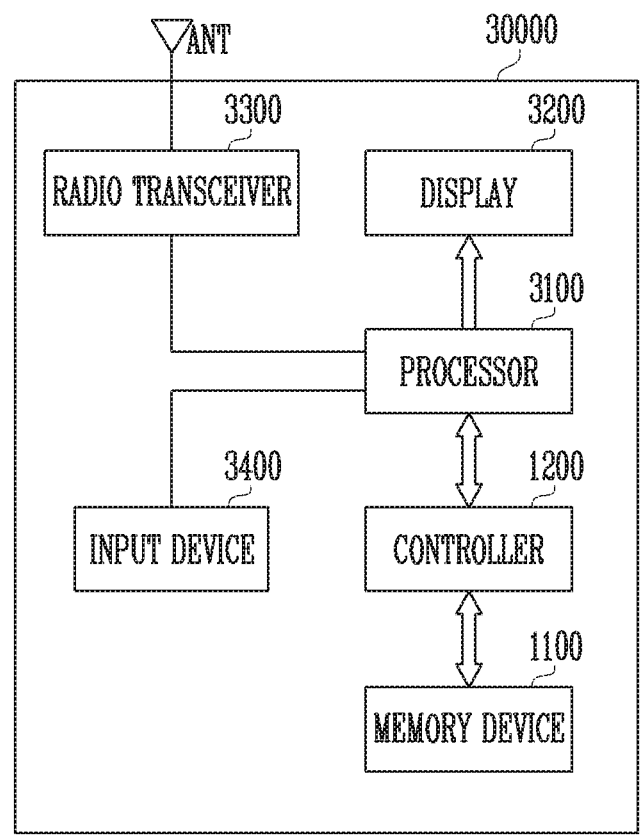
FIG. 11 is a diagram describing another embodiment of the memory system.

FIG. 11 is a diagram describing another embodiment of the memory system.

Referring to FIG. 11, a memory system 30000 may be implemented as a cellular phone, a smartphone, a tablet PC, a personal digital assistant (PDA) or a wireless communication device. The memory system 30000 may include the memory device 1100 and the controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the controller 1200.

A radio transceiver 3300 may transmit and receive radio signals through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the controller 1200 or the display 3200. The controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad, a computer mouse, a keypad, or a keyboard. The processor 3100 may control an operation of the display 3200 so that data output from the controller 1200, data output from the radio transceiver 3300, or data output from the input device 3400 is output through the display 3200.

According to an embodiment, the controller 1200 capable of controlling the operation of memory device 1100 may be implemented as a part of the processor 3100 and may also be implemented as a chip separate from the processor 3100. In addition, the memory device 1100 may include the interface circuit 400, such as the memory device 1100 shown in FIG. 1 or the memory device 1100 shown in FIG. 10. In addition, when the memory device 1100 includes only a semiconductor memory as shown in FIG. 9, an interface circuit for data communication between the controller 1200 and the memory device 1100 may be additionally provided. At this time, the interface circuit may be configured as the interface circuit 400 of FIG. 2.

Figure 12:
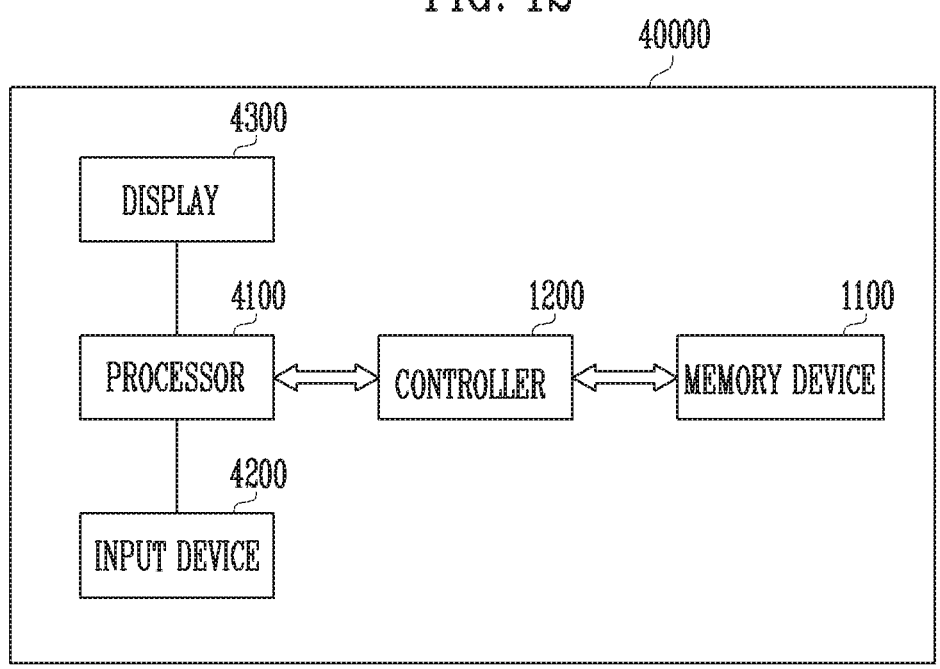
FIG. 12 is a diagram describing another embodiment of the memory system.

FIG. 12 is a diagram describing another example of the memory system.

Referring to FIG. 12, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad, a computer mouse, a keypad, or a keyboard.

The processor 4100 may control the overall operation of the memory system 40000 and control the operation of the controller 1200. According to an embodiment, the controller 1200 capable of controlling the operation of memory device 1100 may be implemented as a part of the processor 4100 or may be implemented as a chip separate from the processor 4100. In addition, the memory device 1100 may include the interface circuit 400, such as the memory device 1100 shown in FIG. 1 or the memory device 1100 shown in FIG. 10. In addition, when the memory device 1100 includes only a semiconductor memory as shown in FIG. 9, an interface circuit for data communication between the controller 1200 and the memory device 1100 may be additionally provided. At this time, the interface circuit may be configured as the interface circuit 400 of FIG. 2.

Figure 13:
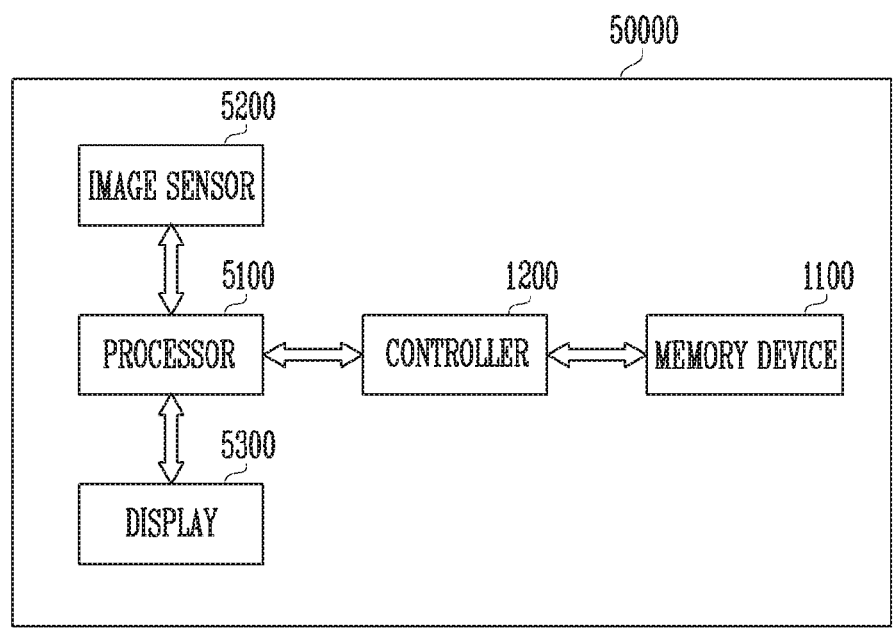
FIG. 13 is a diagram describing another embodiment of the memory system.

FIG. 13 is a diagram describing another embodiment of the memory system.

Referring to FIG. 13, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the controller 1200 capable of controlling a data processing operation, for example, a program operation, an erase operation, or a read operation, of the memory device 1100.

An image sensor 5200 of the memory system 50000 may convert an optical image into digital signals. The converted digital signals may be transmitted to a processor 5100 or the controller 1200. Under the control of the processor 5100, the converted digital signals may be output through a display 5300 or stored in the memory device 1100 through the controller 1200. Data stored in the memory device 1100 may be output through the display 5300 under the control of the processor 5100 or the controller 1200.

According to an embodiment, the controller 1200 capable of controlling the operation of memory device 1100 may be implemented as a part of the processor 5100 or may be implemented as a chip separate from the processor 5100. In addition, the memory device 1100 may include the interface circuit 400, such as the memory device 1100 shown in FIG. 1 or the memory device 1100 shown in FIG. 10. In addition, when the memory device 1100 includes only a semiconductor memory as shown in FIG. 9, an interface circuit for data communication between the controller 1200 and the memory device 1100 may be additionally provided. At this time, the interface circuit may be configured as the interface circuit 400 of FIG. 2.

Figure 14:
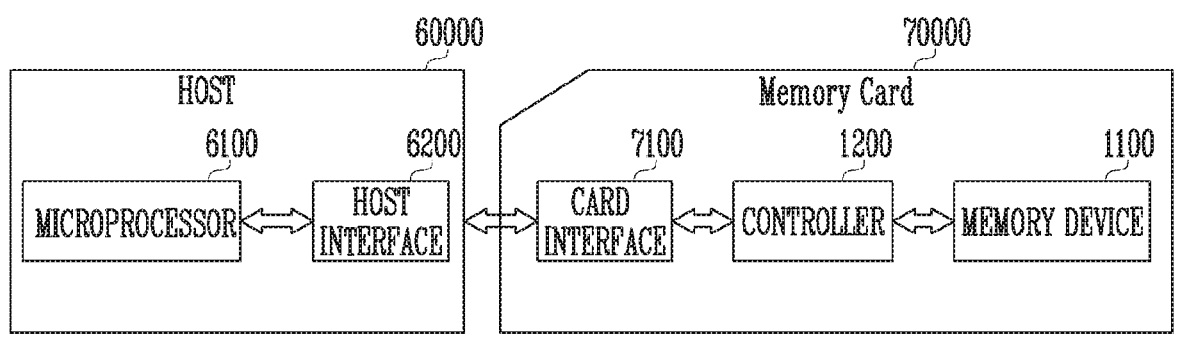
FIG. 14 is a diagram describing another embodiment of the memory system.

FIG. 14 is a diagram describing another embodiment of the memory system.

Referring to FIG. 14, a memory system 70000 may be implemented as a memory card or a smart card. The memory system 70000 may include the memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory device 1100 may include the interface circuit 400, such as the memory device 1100 shown in FIG. 1 or the memory device 1100 shown in FIG. 10. In addition, when the memory device 1100 includes only a semiconductor memory as shown in FIG. 9, an interface circuit for data communication between the controller 1200 and the memory device 1100 may be additionally provided. At this time, the interface circuit may be configured as the interface circuit 400 of FIG. 2.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the interface 6200 may perform data communication with the memory device 1100 through the card interface 7100 and the controller 1200 under control of a microprocessor 6100.

Although the present disclosure has been described with reference to the limited embodiments and drawings, the present disclosure is not limited to the embodiments described above, various changes and modifications may be made from the disclosed description by those skilled in the art to which the present disclosure pertains.

Therefore, the scope of the present disclosure should not be limited to the described embodiments, but should be determined by the equivalents of the claims, as well as the following claims.

In the embodiments described above, all of the steps may optionally be performed or omitted. Also, the steps in each embodiment need not occur in order, but may be reversed. Meanwhile, the embodiments of the present disclosure disclosed in this specification and the drawings are only illustrative of specific examples for the purpose of easily describing technical contents of this specification and understanding of this specification, and are not intended to limit the scope of this specification. That is, it is apparent to those skilled in the art to which the present disclosure pertains that other modification examples based on the technical spirit of the present disclosure are possible.

Meanwhile, although this specification and the drawings disclose various embodiments of the present disclosure, and although specific terms are used, the terms are used in general meaning for purposes of easily describing technical contents of the present disclosure and understanding of the present disclosure, and are not intended to limit the scope of the present disclosure. It is apparent to those skilled in the art to which the present disclosure pertains that other modification examples based on the technical spirit of the present disclosure may be carried out in addition to the embodiments disclosed herein.

Although the present disclosure describes specific embodiments, various changes and modifications may be made without departing from the scope and technical spirit of the present disclosure. Therefore, the scope of the present disclosure should not be limited to the above-described embodiments, but should be determined by the equivalents of the claims of the present disclosure as well as the following claims.

What is claimed is:

1. A memory system comprising:
   a memory device including an interface circuit and a semiconductor memory; and
   a controller configured to generate a command for controlling the memory device and output the command to the memory device,
   wherein the interface circuit receives the command, transmits the received command to the semiconductor memory when the received command corresponds to the semiconductor memory, performs a training operation of the interface circuit when the received command corresponds to the interface circuit and the received command is a specific command, and blocks transfer of the received command to the semiconductor memory during the training operation of the interface circuit.

2. The memory system according to claim 1, wherein the specific command is a command corresponding to the training operation of the interface circuit.

3. The memory system according to claim 1, wherein the command includes an address, and the address corresponds to the semiconductor memory or the interface circuit.

4. The memory system according to claim 1, wherein, when the command corresponds to the semiconductor memory, the interface circuit retimes first data received from the controller and transmits the first data to the semiconductor memory, or retimes second data received from the semiconductor memory and transmits the second data to the controller.

5. The memory system according to claim 1, wherein the interface circuit performs a write training operation of storing training data therein in response to the command during the training operation and determines an amount of mismatch between an internal clock of the interface circuit and the training data during the write training operation.

6. The memory system according to claim 5, wherein the interface circuit performs a read training operation of reading the training data therefrom in response to the command during the training operation and determines the amount of mismatch between the internal clock of the interface circuit and the read training data during the read training operation.

7. The memory system according to claim 6, wherein the interface circuit sets a delay time of the first data and a delay time of the second data according to the amounts of mismatch between the training data and the internal clock determined during the training operation.

8. The memory system according to claim 1, wherein the interface circuit comprises:
   a timing control circuit configured to control and rearrange timings of the command and the training data received from the controller, and output the rearranged command and training data;
   a processor configured to:
   receive the command from the controller;
   deactivate a blocking enable signal when the command corresponds to the semiconductor memory; and
   activate the blocking enable signal, and generate and output a write training signal and a read training signal, when the command corresponds to the training operation of the interface circuit;
   a training control circuit configured to generate and output a write enable signal in response to the write training signal, and generate and output a read enable signal in response to the read training signal;
   a data storage circuit configured to perform a write operation of storing therein the training data received from the timing control circuit in response to the write enable signal and perform a read operation of reading the stored training data therefrom in response to the read enable signal; and
   a blocking circuit configured to block transfer of the command and the training data to the semiconductor memory in response to the activated blocking enable signal,
   wherein the training control circuit sets a first delay time by determining an amount of mismatch between an internal clock of the interface circuit and the training data during the write operation, and sets a second delay time by determining the amount of mismatch between the internal clock and the read training data during the read operation.

9. The memory system according to claim 8,
   wherein the training control circuit generates and outputs a delay control signal based on the first delay time or the second delay time, and
   wherein the timing control circuit controls the timing of write data received from the controller in response to the delay control signal and outputs the write data to the blocking circuit during a normal write operation, controls the timing of read data received from the blocking circuit in response to the delay control signal, and outputs the read data to the controller during a normal read operation.

10. A memory system comprising:
    a controller configured to generate and output a first command or a second command corresponding to a training operation;
    an interface circuit configured to perform a first training operation thereto in response to the first command, or transfer the second command to a memory device; and
    the memory device configured to perform a second training operation in response to the second command,
    wherein the interface circuit blocks transfer of the first command to the memory device during the first training operation.

11. The memory system according to claim 10,
    wherein the interface circuit performs a write training operation thereto during the first training operation in response to the first command to set a first delay time of write data received from the controller during the write training operation, and
    wherein the interface circuit performs a read training operation thereto during the first training operation in response to the first command to set a second delay time of read data read therefrom during the read training operation.

12. The memory system according to claim 10, wherein the first command includes an address corresponding to the interface circuit and the second command includes an address corresponding to at least one of a plurality of semiconductor memories included in the memory device.

13. The memory system according to claim 10, wherein the interface circuit comprises:
    a timing control circuit configured to rearrange timings of the first command, the second command, and training data received from the controller, and output the rearranged timings of the first command, second command and training data;
    a processor configured to receive the first command or the second command from the controller, activate a blocking enable signal, and generate and output a write training signal and a read training signal when the first command is received;
    a training control circuit configured to generate and output a write enable signal in response to the write training signal, and generate and output a read enable signal in response to the read training signal;
    a data storage circuit configured to perform a write operation of storing therein, the training data received from the timing control circuit in response to the write enable signal, and perform a read operation of reading the stored training data therefrom in response to the read enable signal; and
    a blocking circuit configured to block transfer of the first command and the training data to the memory device in response to the activated blocking enable signal.

14. The memory system according to claim 13,
    wherein the processor deactivates the blocking enable signal when the second command is received, and
    wherein the blocking control circuit transmits the second command and the training data to the memory device in response to the deactivated blocking enable signal.

15. The memory system according to claim 13, wherein the training control circuit sets a first delay time by determining an amount of mismatch between an internal clock of the interface circuit and the write training data during the write operation, and sets a second delay time by determining the amount of mismatch between the internal clock and the read training data during the read operation.

16. The memory system according to claim 15,
wherein the training control circuit generates and outputs a delay control signal based on the first delay time or the second delay time, and
wherein the timing control circuit controls the timing of write data received from the controller in response to the delay control signal and outputs the write data to the blocking circuit during a normal write operation, and controls the timing of read data received from the blocking circuit in response to the delay control signal and outputs the read data to the controller during a normal read operation.

17. A method of operating a memory system, the method comprising:
providing an interface circuit connected between a controller and a semiconductor memory, the interface circuit configured to mediate data communication between the controller and the semiconductor memory;
generating, by the controller, a first command for a training operation of the interface circuit or a second command for a training operation of the semiconductor memory, and transmitting the first command or the second command to the interface circuit;
performing, by the interface circuit, the training operation in response to the first command, and blocking, by the interface circuit, transfer of the first command to the semiconductor memory during the training operation of the interface circuit; and
transmitting, by the interface circuit, the second command to the semiconductor memory to perform, by the semiconductor memory, the training operation in response to the second command.

18. The method according to claim 17,
wherein the training operation includes a write training operation and a read training operation, and
wherein the training operation of the interface circuit further includes an operation of setting delays of write data transmitted from the controller to the interface circuit, and read data transmitted from the interface circuit to the controller according to operation results of the write training operation and the read training operation.

19. The method according to claim 17, wherein the first command includes an address corresponding to the interface circuit and the second command includes an address corresponding to the semiconductor memory.

* * * * *